(12) United States Patent
Bello et al.

(10) Patent No.: US 8,975,094 B2
(45) Date of Patent: Mar. 10, 2015

(54) TEST STRUCTURE AND METHOD TO FACILITATE DEVELOPMENT/OPTIMIZATION OF PROCESS PARAMETERS

(71) Applicant: GLOBALFOUNDRIES, Inc., Grand Cayman (KY)

(72) Inventors: Abner F. Bello, Clifton Park, NY (US); Shubhankar Basu, Philadelphia, PA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/745,929

(22) Filed: Jan. 21, 2013

(65) Prior Publication Data

US 2014/0203279 A1 Jul. 24, 2014

(51) Int. Cl.
*H01L 21/66* (2006.01)
*G01R 31/26* (2014.01)
*G03F 7/20* (2006.01)

(52) U.S. Cl.
CPC ............... *H01L 22/30* (2013.01); *H01L 22/12* (2013.01); *G03F 7/70483* (2013.01)
USPC .................. 438/14; 438/7; 365/401; 257/48

(58) Field of Classification Search
CPC ............................ H01L 22/34; G03F 7/70633
USPC ............. 257/48, E23.001, E21.001; 438/5, 7
See application file for complete search history.

(56) References Cited

U.S. PATENT DOCUMENTS

| 7,467,064 | B2 * | 12/2008 | Vuong et al. ................... 702/181 |
| 8,072,601 | B2 * | 12/2011 | Fukuhara et al. ............. 356/401 |
| 8,450,126 | B2 | 5/2013 | Chen et al. |
| 2001/0015811 | A1 | 8/2001 | Ravid et al. |
| 2008/0246030 | A1 * | 10/2008 | Satya et al. ...................... 257/48 |
| 2013/0084655 | A1 * | 4/2013 | Yue et al. ........................... 438/7 |
| 2013/0270557 | A1 | 10/2013 | Shiu et al. |

* cited by examiner

*Primary Examiner* — Matthew Reames
*Assistant Examiner* — Vincent Wall
(74) *Attorney, Agent, or Firm* — Kevin P. Radigan, Esq.; Heslin Rothenberg Farley & Mesiti P.C.

(57) ABSTRACT

A test structure and method are provided to facilitate developing or optimizing a fabrication process by determining values of one or more lithography process parameters for use in semiconductor device fabrication. The test structure is configured to facilitate determining values of the one or more fabrication process parameters, and includes a plurality of test structure components arranged on a substrate according to a test pattern. The test pattern may be based on: varying distances between the test structure components according to a first rule; varying distances between centers of the test structure components according to a second rule; and/or varying at least one dimension of the test structure components according to a third rule. The method may further include determining dimensions of one or more components of the test structure using, for example, scatterometry, and using the dimensions of the components to ascertain one or more fabrication process parameters.

5 Claims, 9 Drawing Sheets

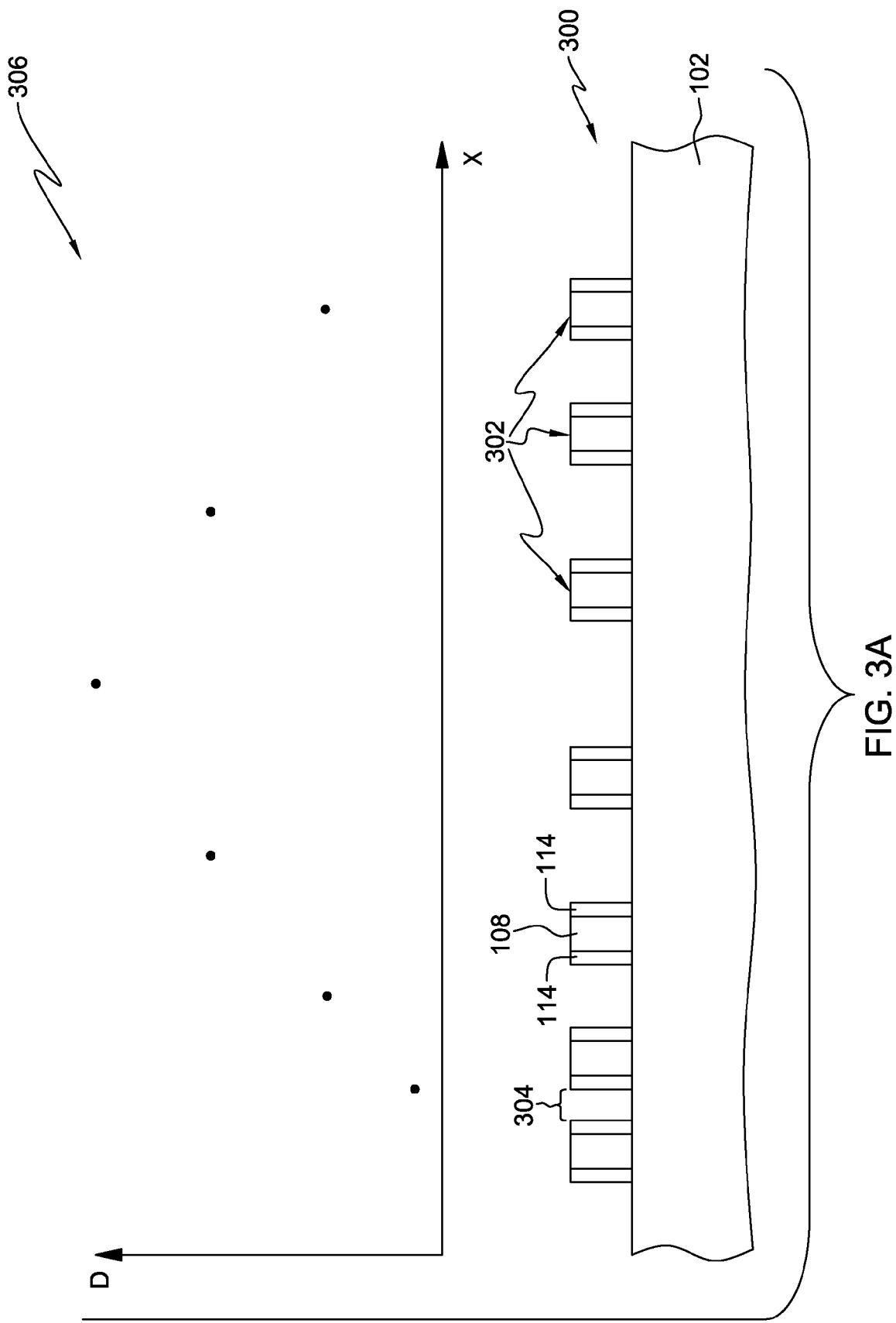

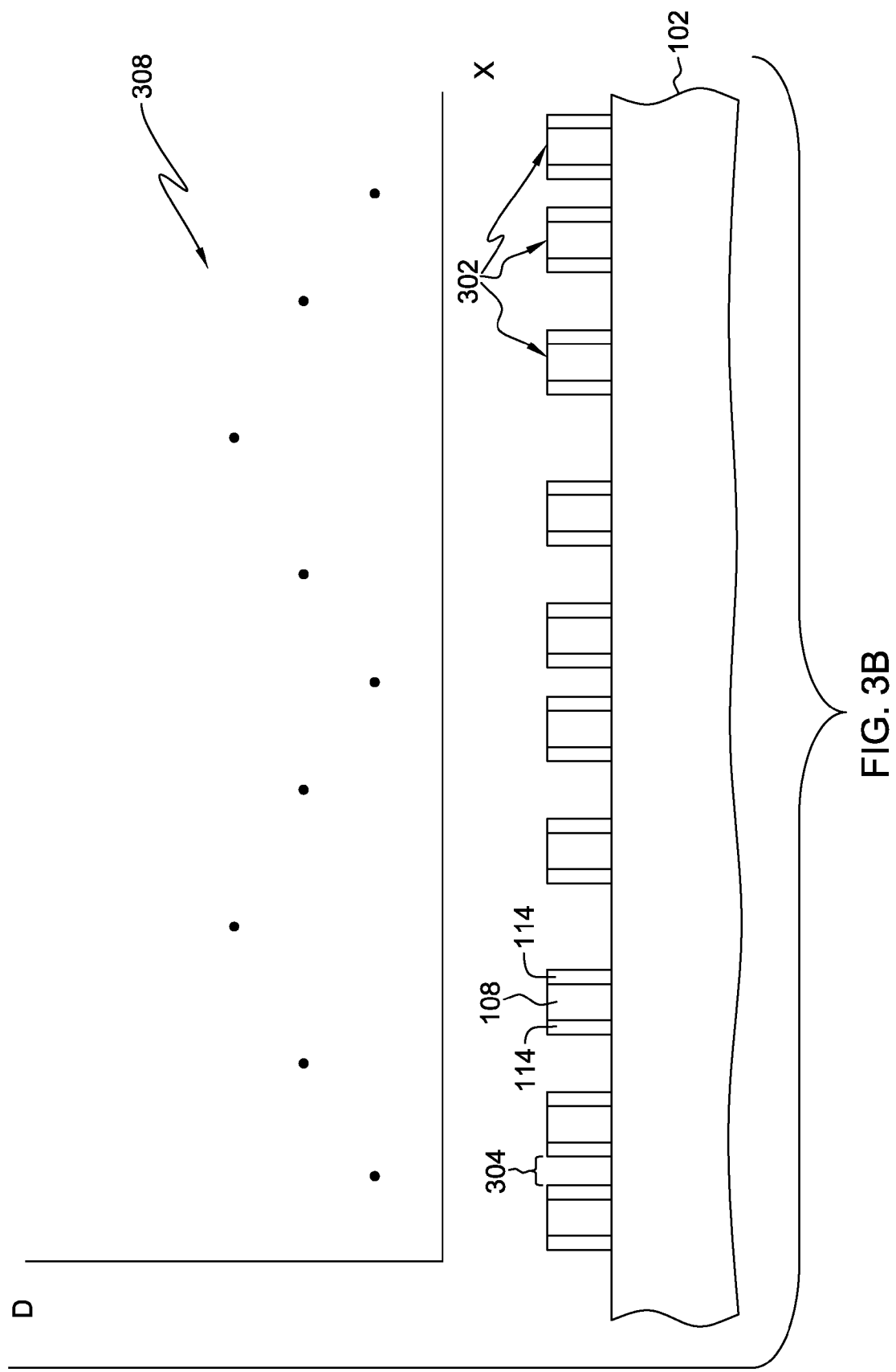

TEST STRUCTURE AND METHOD TO FACILITATE DEVELOPMENT/OPTIMIZATION OF PROCESS PARAMETERS

FIELD OF THE INVENTION

The present invention relates generally to methods of fabricating integrated circuits, and more particularly, to methods and structures for facilitating the development and/or optimization of one or more process parameters employed in fabricating integrated circuits.

BACKGROUND OF THE INVENTION

By way of example, one significant phase of integrated circuit fabrication involves the process of transferring a mask pattern to a wafer with subsequent etching to remove unwanted material, for instance, to facilitate forming fin structures and/or gate structures of fin-type field-effect transistors (FINFETs), or field-effect transistors (FETs) in general. This process is typically referred to as photolithography, or simply lithographic processing. Lithography and other similar fabrication processes (e.g., etch processes) can be optimized by varying numerous process parameters based on in-line or off-line inspection results. Conventional parameter optimization processes can be time consuming and add significant cost to the integrated circuit fabrication process.

SUMMARY OF THE INVENTION

Accordingly, there is provided herein, in one aspect, a method of developing or optimizing a semiconductor device fabrication process. The method includes, for instance, facilitating ascertaining one or more fabrication process parameters for use in semiconductor device fabrication. The facilitating includes fabricating a test structure configured to facilitate determining values of the one or more fabrication process parameters. The test structure includes a plurality of test structure components arranged on a substrate according to a test pattern, with the test pattern being based on one or more of: varying distances between the test structure components according to a first rule; varying distances between centers of the test structure components according to a second rule; or varying at least one dimension of the test structure components according to a third rule.

In another aspect, there is provided herein a test structure which includes a plurality of test structure components arranged on a substrate according to a test pattern and configured to facilitate determining values of one or more fabrication process parameters for use in semiconductor device fabrication. The test pattern can be based on: varying distances between the test structure components according to a first rule; varying distances between centers of the test structure components according to a second rule; and/or varying at least one dimension of the test structure components according to a third rule.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 3A-3D schematically illustrate various configurations and arrangements of a plurality of test structure components on a substrate, in accordance with one or more aspects of the present invention;

DETAILED DESCRIPTION OF THE INVENTION

Figure 1A:
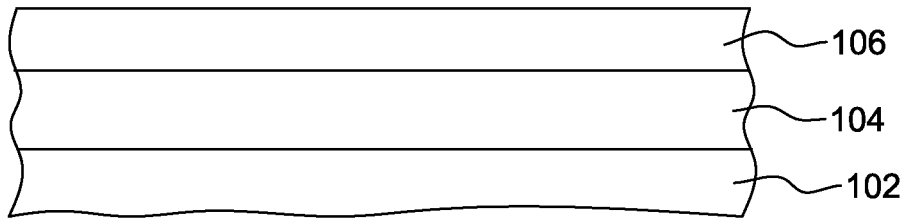
FIGS. 1A-1G schematically illustrate one example of manufacturing fin structures and/or gate structures using a semiconductor device fabrication process.
Figure 1B:
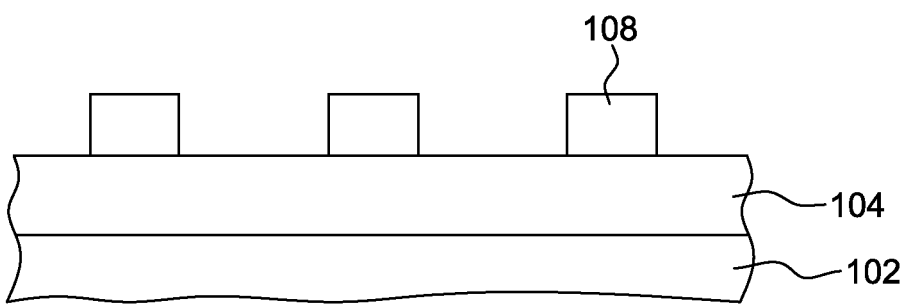

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, wherein the same reference numbers used throughout different figures designate the same or similar components.

In fabricating electronic circuits, including, for example, integrated circuits (ICs) or semiconductor devices, the density of components continues to increase to achieve greater functionality and reduced manufacturing costs. This desire for large scale integration has led to a continued shrinking of circuit dimensions and component features. The ability to reduce the size of component features is driven, at least in part, by performance enhancements in manufacturing processes by which circuit structures are formed on a wafer. Such performance enhancements include in-line process optimizations, including, for example, measurement and inspection procedures carried out in the normal course of processing production wafers, and off-line process optimizations including, for instance, processing test wafers while varying one or more process parameters.

One aspect of integrated circuit fabrication (which is also referred to herein as semiconductor device fabrication) typically involves use of fabrication processes such as a lithography process for transferring a mask pattern to a wafer, with subsequent etching to remove unwanted material. Lithography and etching processes may be used, for instance, to facilitate forming circuit structures such as fin structures and/or gate structures. In one illustrative example, fin structures and gate structures may be fabricated via a sidewall image transfer (SIT) (or self-aligned double patterning (SADP)) process.

Traditional lithography techniques to pattern lined structures are becoming more difficult, and expensive, due to the fundamental limits in optical resolution. In the SIT process, however, lithography is used as a starting point to pattern lines, followed by materials processing to produce smaller, narrower lines, thus avoiding the fundamental physical limits of resolution. In the SIT process, a film on the sidewall of a line structure, referred to in the art as a mandrel, is used as the template from which to pattern the structure underneath it. When the mandrel is removed, the sidewall remains, and performs a function equivalent to what photoresist does for patterning underlying films. The SIT process is sometimes referred to as an SADP process, due to the doubling of the number of lined structures from the number of mandrels.

By way of example, FIGS. 1A-1G depict one embodiment of an SIT process to facilitate fabrication of semiconductor device fins. Similar processing may be employed to fabricate semiconductor gate structures.

Referring to FIG. 1A, the process may employ an intermediate structure 100, which includes a substrate 102, a layer 104 disposed over substrate 102, and a photoresist layer 106 disposed over layer 104. Intermediate structure 100 might be an entire semiconductor wafer or a portion thereof. Substrate 102 can include, for example, a semiconductor material, such as, e.g., silicon (Si), germanium (Ge), a compound semiconductor material, a layered semiconductor material, a silicon-on-insulator (SOI) material, a SiGe-on-insulator (SGOI) material, or a germanium-on-insulator (GOI) material, etc. Layer 104 may be or may include one or more layers of conductive material(s), dielectric material(s), and/or semiconductor material(s) provided over substrate 102 using a variety a techniques. Photoresist layer 106 may include one or more of a variety of photoresist materials capable, for instance, of developing photochemical reactions in response to light. Photoresist layer 106 may include, among others, a matrix material or resin, a sensitizer or inhibitor, and a solvent, and be formed using any suitable technique, for example, spin coating deposition over layer 104.

Intermediate structure 100 is subjected to one or more lithographic processing steps. As is known, a desired pattern is transferred to photoresist layer 106 by directing light through a mask (not shown) corresponding to the desired pattern. After a development cycle, the photoresist material in exposed areas becomes soluble and can be removed. Portions of photoresist layer 106 not exposed to a threshold amount of light will not be removed, and thus the process may be employed to form an array of structures, such as the mandrel lines 108 illustrated in FIG. 1B.

Figure 1C:
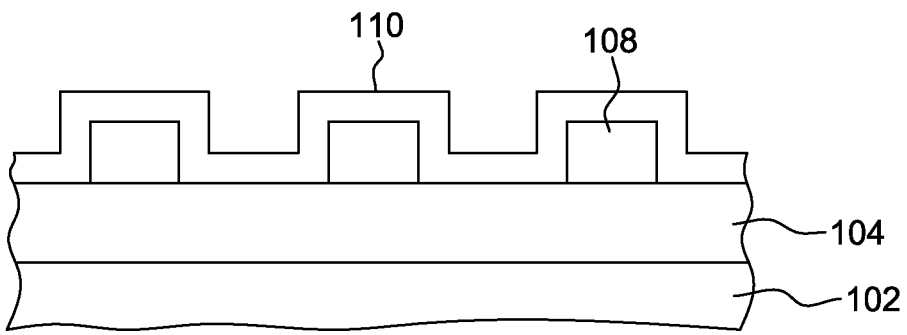

The process may include a spacer or hard mask layer 110 being conformally deposited over structure 100, as illustrated by FIG. 1C. Spacer layer 110, which might include an oxide (such as, for example $SiO_2$), a nitride (such as, for example, $Si_3N_4$), an oxynitride (such as, for example, $SiO_xN_y$) etc., may be conformally deposited using a variety of techniques, such as, for example, chemical vapor deposition (CVD) or atomic layer deposition (ALD).

Figure 1D:
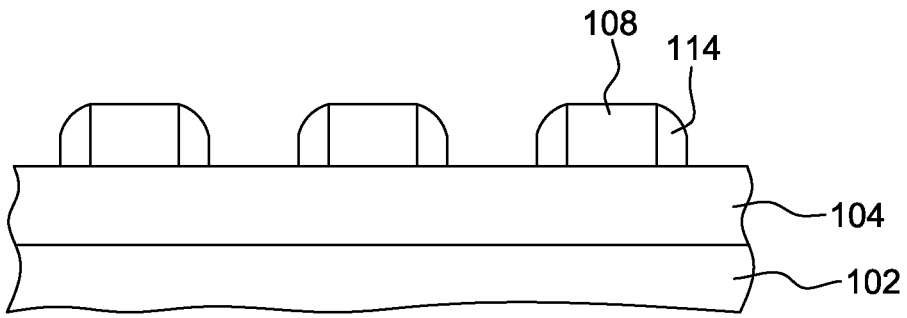
Figure 1E:
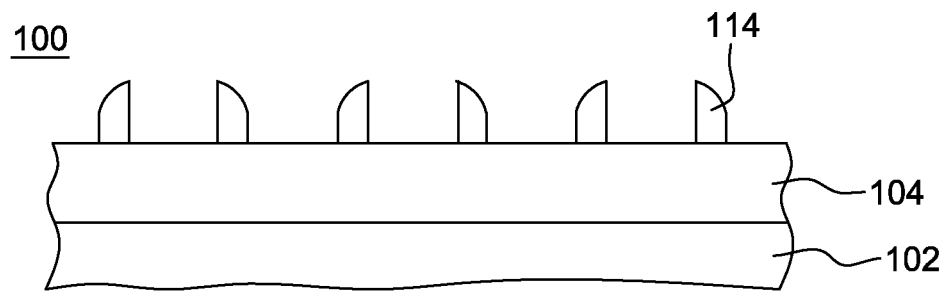
Figure 1F:
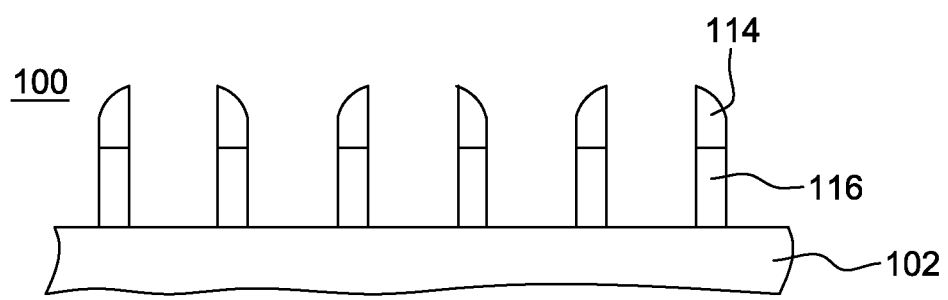
Figure 1G:
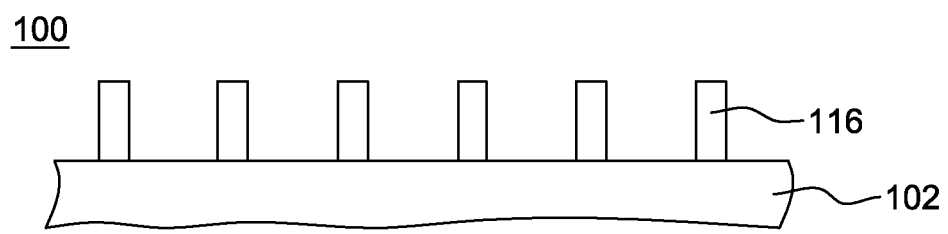

As illustrated in FIG. 1D, spacer layer 110 is etched, for instance, by any appropriate combination of dry and wet etching, to form sidewall spacers 114 adjacent to or along the sidewalls of mandrel lines 108. Following sidewall-spacer formation, mandrel lines 108 may be removed by selective etching of the lines, leaving sidewall spacers 114, as illustrated in FIG. 1E. Fins 116 are subsequently formed by (for instance) partially or fully etching layer 104, as depicted in FIG. 1F, after which, sidewall spacers 114 may be removed (as depicted in FIG. 1G).

Figure 2A:
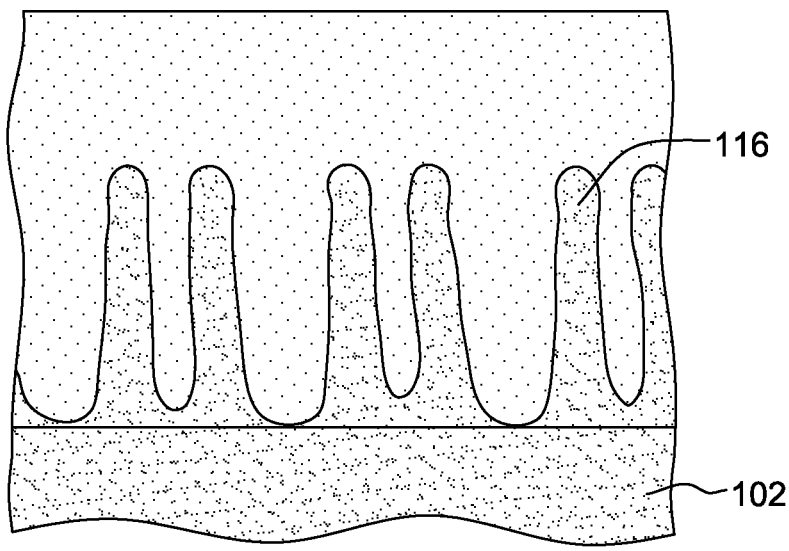
FIGS. 2A-2B schematically illustrate examples of fin structures having substantially different width and height, respectively.
Figure 2B:
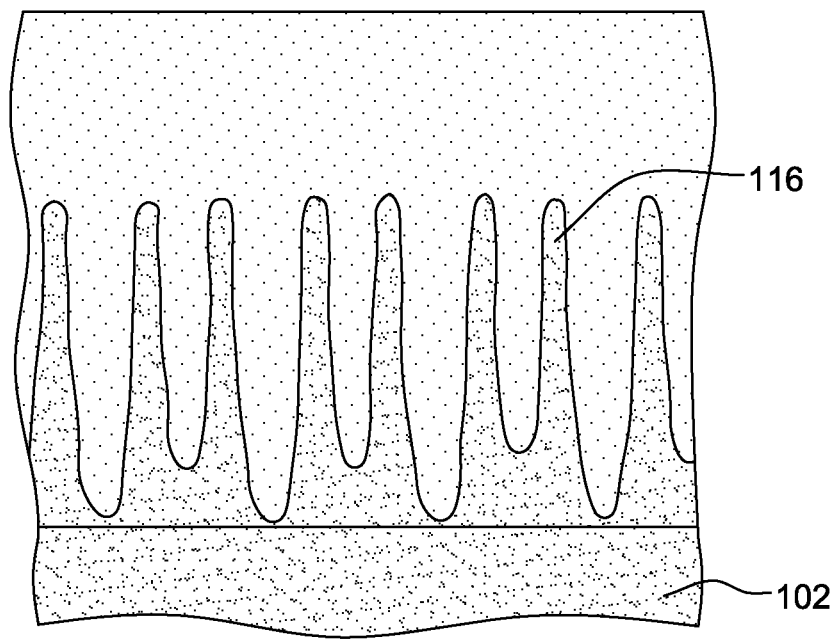

Evenly spaced fins with substantially similar dimensions may be desired or expected after an SIT process, such as described above in connection with FIGS. 1A-1G. However, depending upon the various process parameters employed, fins 116 may be produced having (for instance) substantially different width, such as depicted in FIG. 2A. In another case, fins 116 may be produced with substantially different height, as illustrated in FIG. 2B. The process development and/or optimization stage serves to determine the values of one or more of process parameters, such as, for example, etching time, RF power, bias voltage to the wafer, gas flow rate to the chamber, etc., that would result (for instance) in evenly spaced fin or gate structures having substantially similar dimensions. Note that a wafer during fabrication may contain multiple semiconductor devices, where (for instance) one semiconductor device may have one set of evenly spaced fins or gate structures, and another device may have another set of evenly spaced fins or gate structures, but a different periodicity.

Generally stated, disclosed herein are enhanced processes or methods for developing and/or optimizing a semiconductor device fabrication process, and in particular, for selecting or optimizing one or more fabrication process parameters. The method may include, for instance, facilitating ascertaining one or more fabrication process parameters for use in semiconductor device fabrication. The facilitating may include fabricating a test structure configured to facilitate determining values of the one or more fabrication process parameters. The test structure may include a plurality of test structure components arranged on a substrate according to a test pattern. The test pattern may be based on one or more of: varying distances between the test structure components according to a first rule, varying distances between centers of the test structure components according to a second rule, and/or varying at least one dimension of the test structure components according to a third rule. In one or more embodiments, the method may include determining dimensions of one or more components of the test structure, and determining, based on the dimensions of the one or more components of the test structure, values of one or more parameters of the fabrication process. The determining of dimensions for the one or more components of the test structure can be performed, for instance, using scatterometry. The plurality of test structure components may include (for instance) one or more fins and/or one or more gate structures disposed, for example, on a substrate.

By way of example, the first rule could include varying the distances between the test structure components as a function of positions of the test structure components on the substrate, such as (for instance) varying the distances between the test structure components according to a defined pattern, such as one which includes a triangular waveform and/or a sinusoidal waveform. The second rule could vary the distances between the centers of the test structure components as a function of the positions of the test structure components on the substrate, such as according to a defined pattern (for example) which includes one or more of a triangular waveform or a sinusoidal waveform. Further, the third rule could vary at least one dimension of a test structure component as a function of a position of the test structure component on the substrate, for instance, according to a defined pattern which includes a triangular waveform or a sinusoidal waveform.

In one illustrative example, a fabrication process may be optimized by applying the process to fabricating a test structure, such as disclosed herein, and determining therefrom the values of one or more process parameters based on dimensions of one or more components of the test structure components after the fabrication processing. By way of example, a test structure 300 may include a plurality of components 302 arranged on a substrate according to one or more test patterns, such as illustrated in the examples of FIGS. 3A-3D. In the depicted examples, the test structure components 302 include sidewall spacers 114 adjacent to or along multiple sidewalls of the respective mandrel line 108.

Test structure components 302 may be formed on substrate 102 and arranged according to a defined pattern designed to minimize the number of iterations in the process development and/or optimization stage. As noted, the test pattern may include a defined pattern with varying distances between the structure components 302 according to a pre-defined rule, which can prescribe (for example) varying distances 304 between test structure components 302 (including situations when the width of test structure components 302 is constant or variable), varying distances between the centers of test structure components 302 (including situations when the width of test structure components 302 is constant or variable), and/or varying one or more dimensions of the test structure components 302, as described further below with reference to the examples of FIGS. 3A-3D.

In some implementations, distances 304 between test structure components 302 can be varied according to a defined waveform, such as a triangular wave 306 defining a distance (D) between two neighboring test structure components 302 as a function of their respective positions on substrate 102 in a direction (x), as shown in FIG. 3A. In one illustrative example, the distance between two neighboring structure components 302 can be defined as a piecewise linear function of their respective positions on the surface of substrate 102, as represented by:

$$D_{(i,i-1)} = \begin{cases} k*x_i + b_1 & \text{if } i < n \\ -k*x_i + b_2 & \text{if } i \geq n \end{cases}$$

wherein:
$D_{(i, i-1)}$ denotes the distance between the (i−1)-th and i-th test structure components disposed on the surface of substrate 102;
$x_i$ denotes the position of the i-th test structure component on the surface of substrate 102; and
$b_1$, $b_2$, and k denote constants defining the intercepts and the slope of the two respective linear functions.

In one or more implementations, distances 304 between test structure components 302 may be varied according to a defined waveform, such as a sinusoidal wave 308 defining a distance (D) between two neighboring test structure components 302 as a function of the respective positions on substrate 102 in a direction (x), as shown in FIG. 3B. In one illustrative example, the distance between two neighboring test structure components 302 may be defined as a sinusoidal function of their respective positions on the surface of substrate 102, as represented by:

$$D_{(i,i-1)} = a*\sin(c*x_i)$$

wherein:
$D_{(i, i-1)}$ denotes the distance between the (i−1)-th and i-th test structure components disposed on the surface of substrate 102;
$x_i$ denotes the position of the i-th structure component on the surface of substrate 102; and
a and c denote constants defining the amplitude and the frequency of the sinusoid.

Figure 3C:
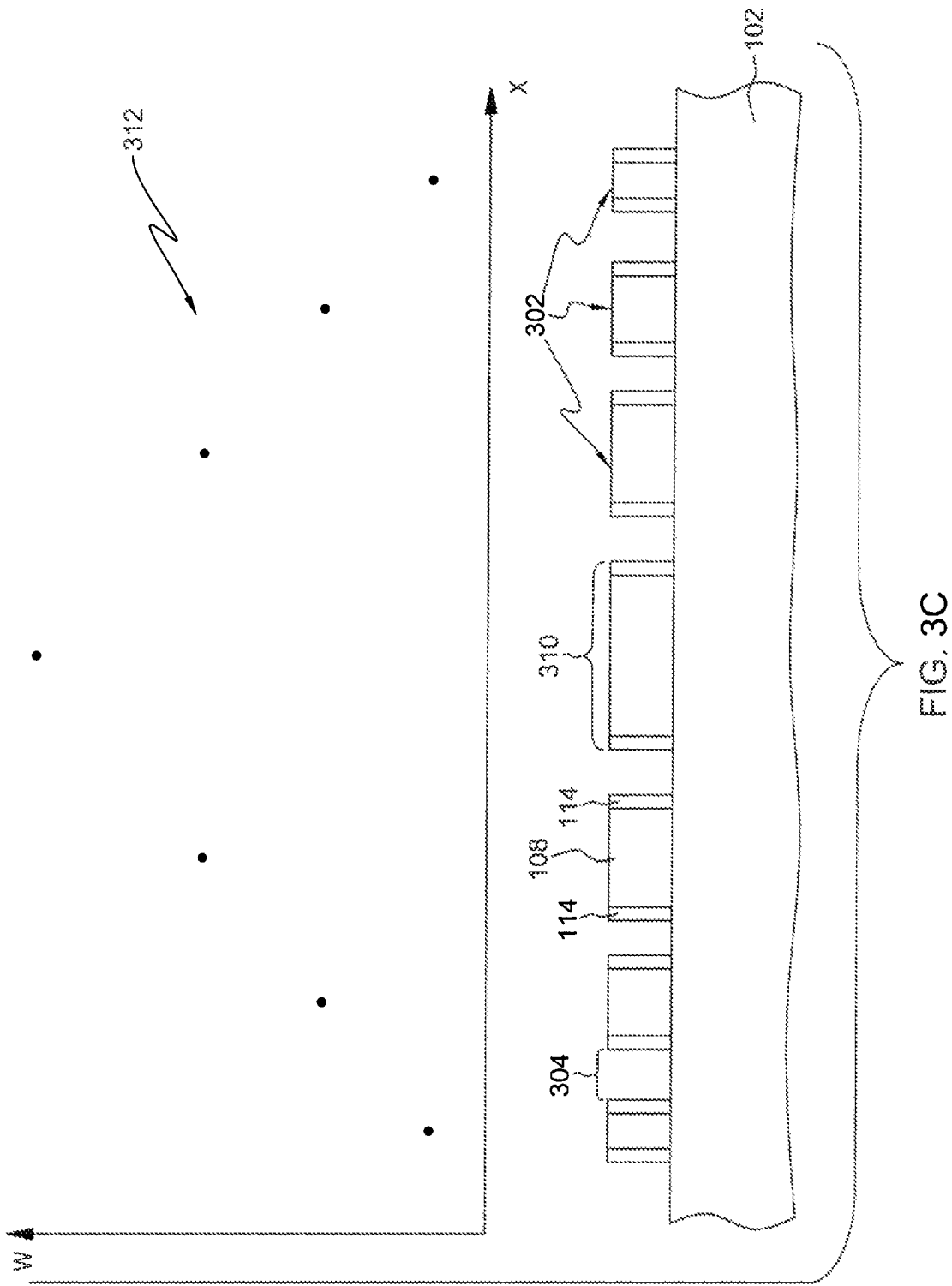
Figure 3D:
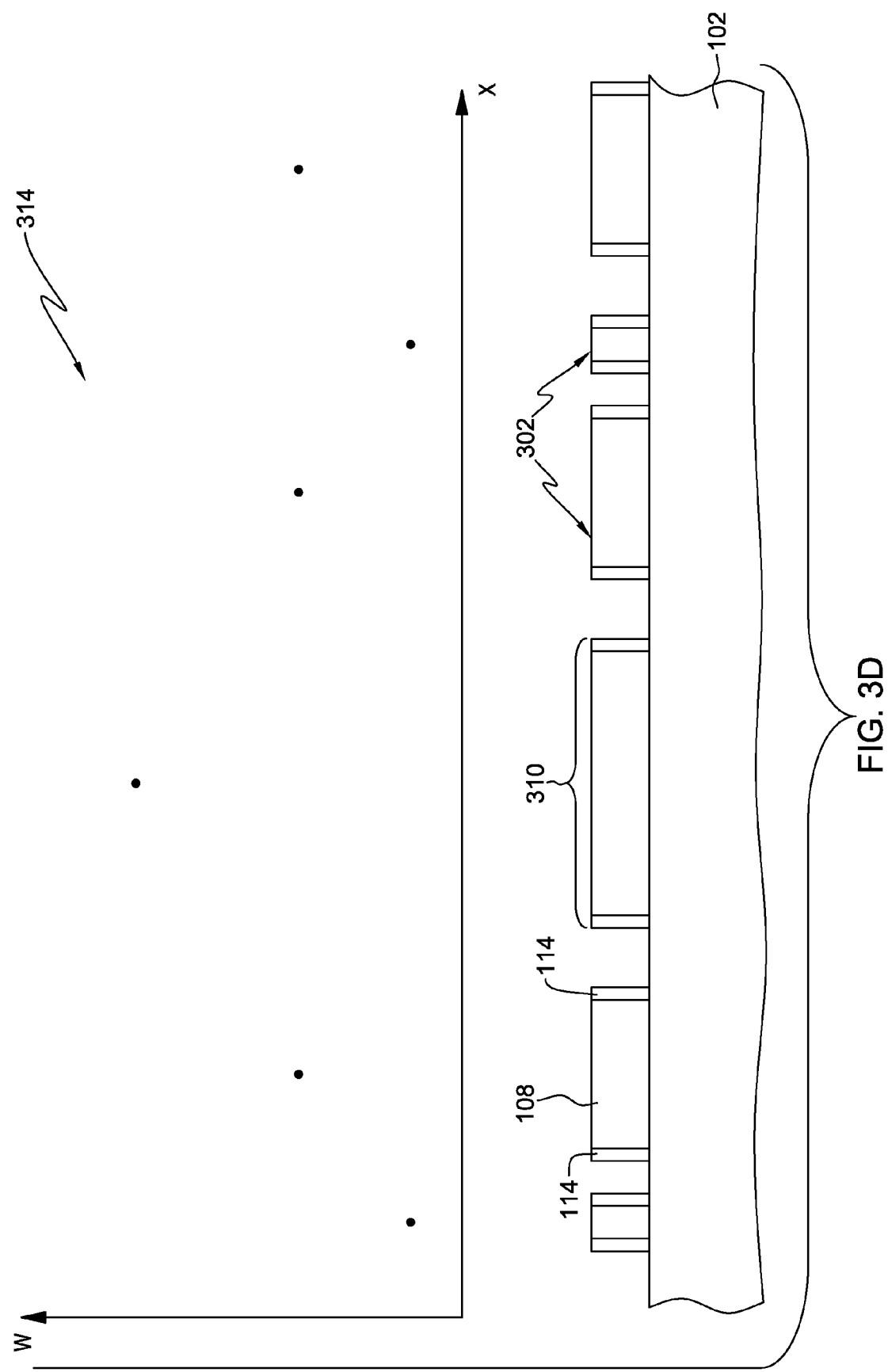

In one or more implementations, the width 310 of test structure components 302 may vary according to a defined pattern, such as a triangular wave 312 defining the width (W) of a test structure component 302 as a function of its position on substrate 102 in a direction (x), as schematically shown in FIG. 3C. In one illustrative example, the width of a structure component can be defined as a piecewise linear function of its position on the surface of substrate 102, as represented by:

$$W_i = \begin{cases} k*x_i + b_1 & \text{if } i < n \\ -k*x_i + b_2 & \text{if } i \geq n \end{cases}$$

wherein:
$W_i$ denotes the width of the i-th test structure component;
$x_i$ denotes the position of the i-th structure component on the surface of substrate 102; and
$b_1$, $b_2$, and k denote constants defining the intercepts and the slope of the two respective linear functions, In one or more implementations, the widths 310 of test structure components 302 may be varied according to a defined pattern, such as a sinusoidal wave 314 defining the width (W) of a test structure component 302 as a function of its position on substrate 102 in a direction (x), as shown in FIG. 3D. In one illustrative example, the width of a test structure component can be defined as a sinusoidal function of its position on the surface of substrate 102, as represented by:

$$W_i = a*\sin(c*x_i)$$

wherein:
$W_i$ denotes the width of the i-th test structure component;
$x_i$ denotes the position of the i-th structure component on the surface of substrate 102; and
a and c denote constants defining the amplitude and the frequency of the sinusoid.

Varying distances between test structure components 302 on the surface of substrate 102 and/or widths of test structure components 302 using one or more defined patterns or waveforms, such as the above-discussed triangular and sinusoidal-shaped functions, advantageously allows for a reduction in the number of iterations in the development or optimization of a lithography process. In particular, by providing a spectrum of varying distance and/or width values, the spectra can be tested from a single execution of the lithography process, which allows the lithography process parameters to be more quickly developed or optimized.

As noted above, in one embodiment, the test structure can be produced using the fabrication process being optimized, and the dimensions of one or more resultant test structure components can be determined or measured. In one illustrative example, the above-described processing of FIGS. 1A-1G may be employed to fabricate a test structure configured to facilitate determining values of one or more fabrication process parameters, in accordance with the concepts disclosed herein. The test structure to be fabricated includes a plurality of test structure components arranged on a substrate according to a defined test pattern, such as one or more of the test patterns provided herein by way of example only. As noted, the test pattern may be based on one or more of: varying distances between the test pattern components according to a first rule; varying distances between centers of the test pattern components according to a second rule; or varying at least one dimension of the test structure components themselves according to a third rule.

In particular, and with reference to FIGS. 1A-1G, the test structure can be fabricated by: imaging a test pattern onto, for instance, layer 104 over substrate 102 that is at least partially covered by photoresist layer 106; developing photoresist layer 106; removing the photoresist layer 106 in exposed areas to form an array of mandrel lines 108; depositing a mask layer 110 over the array of mandrel lines 108; and partially removing mask layer 110 to form sidewall spacers 114 adjacent to the mandrel lines 108, as described above with reference to FIGS. 1A-1D. In one implementation, following spacer formation, mandrel lines 108 may be removed by selective etching, leaving sidewalls 114. Fins (or other structures) 116 may be formed by partially etching layer 104, after which spacers 114 may be removed, as depicted in FIGS. 1E-1G.

Following the above-described processing, dimensions of one or more test structure component of the test pattern may be determined or measured. The dimensions of interest can include, for example, one or more the width or height of the fins, or distances between the fins.

Figure 4:
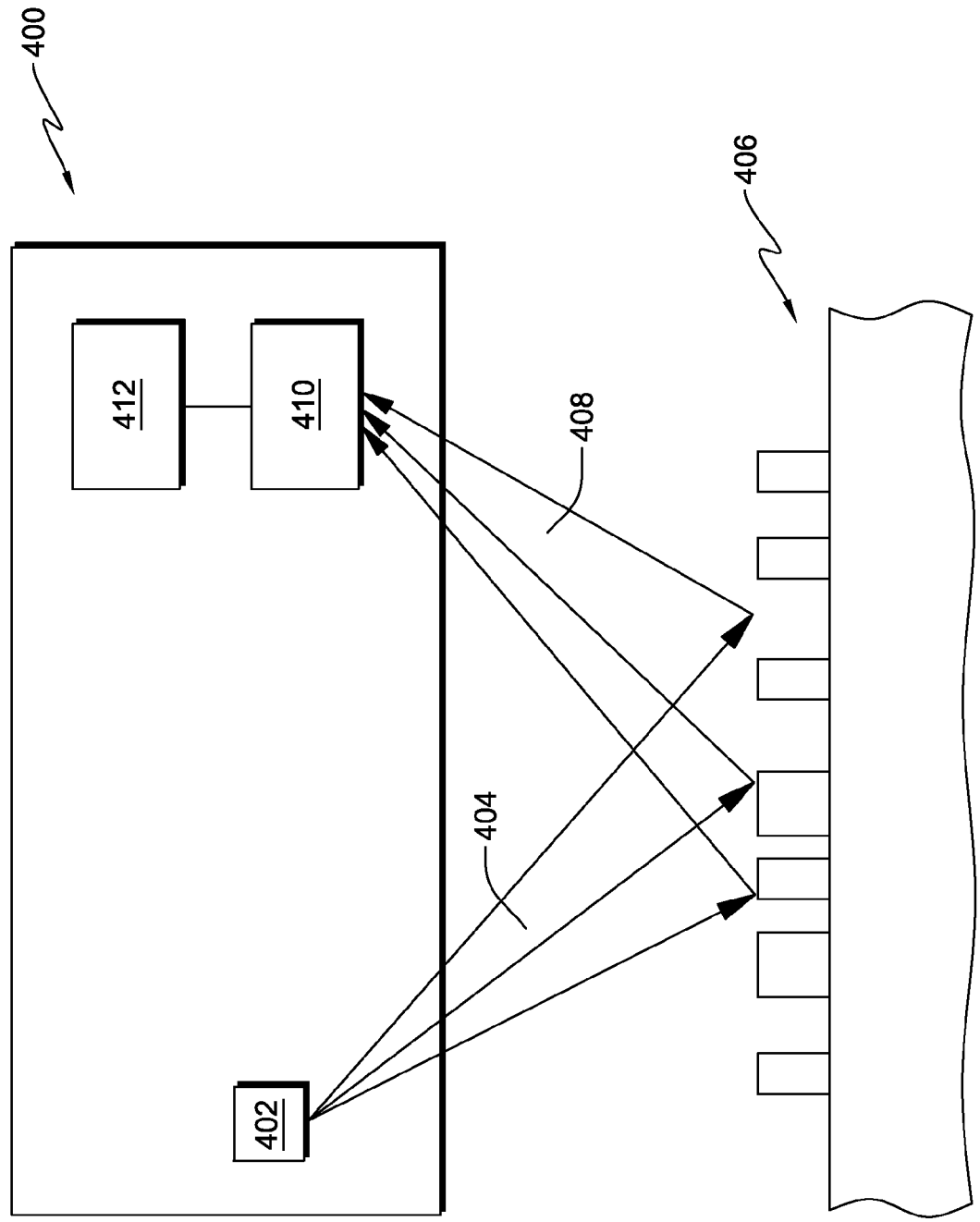
FIG. 4 schematically illustrates one example of a scatterometry apparatus which may be employed in measuring one or more dimensions of test structure components, in accordance with one or more aspects of the present invention.

Dimension measurements may be performed using a variety of techniques, including, for example, scatterometry, which is based on detecting and analyzing changes in the intensity of light reflected from a surface. As depicted in FIG. 4, a scatterometer apparatus 400 may include a radiation source 402 emitting electromagnetic radiation (e.g., visible light 404) onto a target 406, with radiation 408 reflected by target 406 being received by a radiation detector 410. Scatterometer apparatus 400 may also include focusing lenses, optical filters and other auxiliary components not shown in FIG. 4. Radiation detector 410 may be communicatively coupled to a spectrometer 412 configured to measure the spectrum of reflected radiation (expressed, e.g., as the radiation intensity as a function of the wavelength). Spectrometer 412 may be communicatively coupled to a processing device, such as a computer, which may be configured to determine one or more dimensions of the target surface based on the measured spectrum of the reflected radiation.

In one example, where the determined dimensions are used to optimize the fabrication process, the thickness of the sidewall may be employed. In the variable pitch structure, the distance between a fin and its neighbor is varied. There is a desired distance to make evenly spaced fins, and this distance can be ascertained from the variable pitch structure, instead of by depositing several wafers of different sidewall thicknesses. In another example, etch depth may be obtained for different fin distances. It is not typically a linear relationship, so this correlation can be ascertained using the concepts of the present invention, again, without depositing wafers with different sidewall thicknesses.

In another aspect, the above described test structure processing and measurement procedure could be performed in-line, i.e., in the normal course of processing production wafers, by creating a test structure on a portion of the wafer surface. Measuring and analyzing test structure dimensions in-line could advantageously be used to facilitate detecting and rectifying possible deviations in one or more process parameters from their set or target values for the subsequent wafer processing, without (in one embodiment) requiring any off line process testing.

Alternatively, the above describe test structure processing and measurement procedure could be performed off-line, for example, by replacing a production substrate with a substrate to accommodate one or more test structures to be fabricated using varying process parameters. Measuring and analyzing the resultant test structure dimensions in-line or off-line can advantageously be used in fabrication process development and/or optimization, as disclosed herein.

Figure 5:
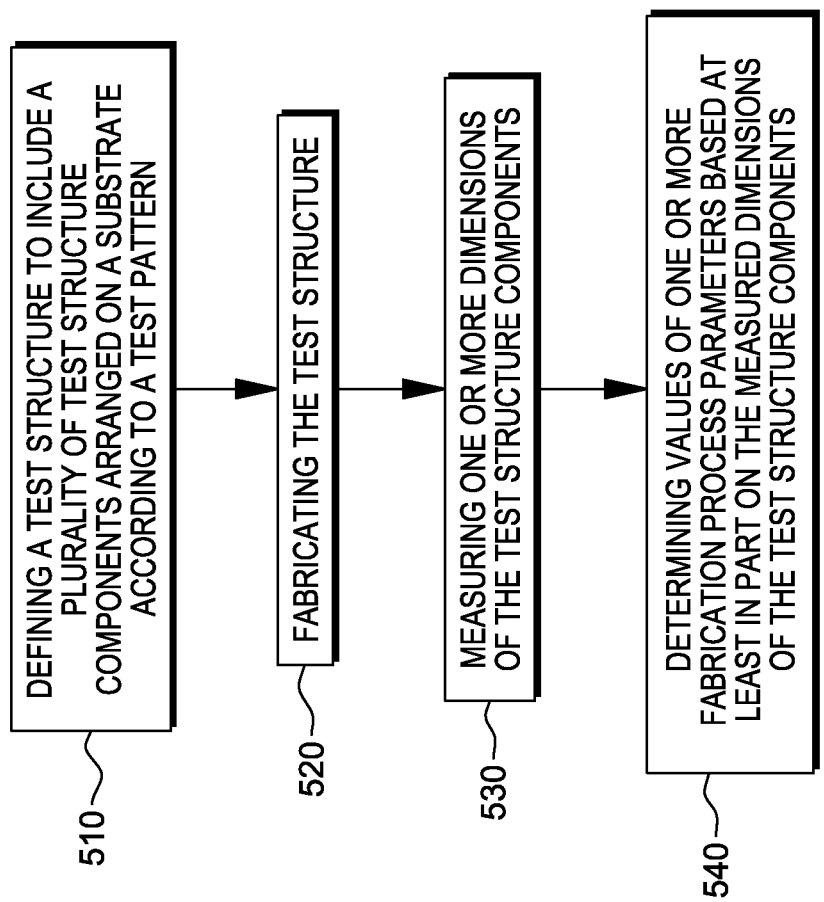
FIG. 5 depicts one illustrative embodiment of a method of developing or optimizing one or more semiconductor device fabrication process parameters, in accordance with one or more aspects of the present invention.

FIG. 5 depicts a process overview of one embodiment of the method of developing or optimizing a fabrication process disclosed herein. The method may include fabricating a test structure including a plurality of test structure components arranged on a substrate according to a defined test pattern 510. The test pattern may include varying distances between the test structure components according to a pre-defined rule, which can prescribe, for example, varying distances between the test structure components (including situations when the width of the test structure components is constant or variable), varying distances between the centers of test structure components (including situations when the width of the test structure components is constant or variable), and/or varying at least one dimension of the test structure components, etc.

The method may further include fabricating the test structure using a fabrication process being developed or optimized 520, and determining dimensions of one or more test structure components 530. In some embodiments, the measurements may be performed using scatterometry methods. The method may facilitate determining values for one or more of the fabrication process parameters, such as, for example, etching time, RF power, bias voltage to the wafer, gas flow rate to the chamber, etc, 540.

The above described method advantageously allows for a more effective optimization of development of the semiconductor device fabrication process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:

fabricating a plurality of test fins from a substrate structure according to a test pattern, the test pattern designed to ascertain one or more fin fabrication process parameters for use in fabrication of one or more fin-type transistors, the facilitating fabricating comprising:

fabricating, using sidewall image transfer processing, a test structure, the sidewall image transfer processing comprising:

providing mandrel lines above a substrate structure with a spacer layer conformally deposited over the varying mandrel lines;

selectively removing the spacer layer from upper surfaces of the mandrel lines leaving, at least in part, sidewall spacers along sidewalls of the mandrel lines;

removing the mandrel lines, leaving the sidewall spacers over the substrate structure as a mask pattern, and using the mask pattern to form the plurality or test fins from the substrate structure, and thereby form the test structure;

wherein the test structure is patterned to facilitate determining values of the one or more fin fabrication process parameters, and the test structure includes the plurality of test fins formed from the substrate structure according to the test pattern, and wherein the test pattern comprising comprises one or more of:

test fins formed with varying distances between the test fins as a mathematical function of positions of the test fins formed from the substrate structure, the varying distances between the test fins being formed in accordance with the mathematical function, using the sidewall image transfer processing, by providing the mandrel lines with varying distances between edges of adjacent mandrel lines, wherein the mathematical function comprises at least one of a triangular waveform or a sinusoidal waveform;

test fins formed with varying distances between centers of the test fins as a function of positions of the test fins formed from the substrate structure, the varying distances between centers of the test fins being formed, using the sidewall image transfer processing, by providing the mandrel lines with varying distances between centers thereof; or test fins formed with at least one physical dimension of the test fins varying as a mathematical function of positions of the test fins formed from the substrate structure, the varying of at least one physical dimension of the test fins being formed in accordance with the mathematical function, using the sidewall image transfer processing, by providing the mandrel lines with variation(s) in at least one physical dimension thereof, wherein the mathematical function comprises at least one of a triangular waveform or a sinusoidal waveform.

2. The method of claim 1, further comprising automatically determining, via a processor, dimensions of one or more test fins of the test structure.

3. The method of claim 2, further comprising automatically determining, via the processor, based on the dimensions of one or more test fins of the test structure, values of the one or more fin fabrication process parameters.

4. The method of claim 2, wherein the determining dimensions of one or more test fins of the test structure is performed using scatterometry.

5. The method of claim 1, wherein the test structure comprises varying distances between the centers of the test fins according to a defined pattern, the defined pattern comprising at least one of a triangular waveform or a sinusoidal waveform.

* * * * *